United States Patent
Danilak et al.

(10) Patent No.: US 12,211,577 B2
(45) Date of Patent: Jan. 28, 2025

(54) LAYOUT FOR DUAL IN-LINE MEMORY TO SUPPORT 128-BYTE CACHE LINE PROCESSOR

(71) Applicant: TACHYUM LTD., Las Vegas, NV (US)

(72) Inventors: Radoslav Danilak, Bratislava (SK); Rodney Mullendore, San Jose, CA (US); William Radke, Los Gatos, CA (US); Chi To, San Jose, CA (US)

(73) Assignee: TACHYUM LTD., Las Vegas, NV (US)

( * ) Notice: Subject to any disclaimer, the term of this patent is extended or adjusted under 35 U.S.C. 154(b) by 190 days.

(21) Appl. No.: 18/048,911

(22) Filed: Oct. 24, 2022

(65) Prior Publication Data

US 2023/0132146 A1 Apr. 27, 2023

Related U.S. Application Data

(60) Provisional application No. 63/270,609, filed on Oct. 22, 2021.

(51) Int. Cl.
| | |
|---|---|
| *G11C 5/04* | (2006.01) |
| *G11C 7/10* | (2006.01) |
| *G11C 7/22* | (2006.01) |
| *G11C 11/4076* | (2006.01) |
| *H05K 1/18* | (2006.01) |

(52) U.S. Cl.
CPC .............. *G11C 5/04* (2013.01); *G11C 7/1072* (2013.01); *G11C 7/222* (2013.01); *G11C 11/4076* (2013.01); *H05K 1/181* (2013.01); *H05K 2201/10159* (2013.01); *H05K 2201/10318* (2013.01)

(58) Field of Classification Search
CPC ......... G11C 5/04; G11C 7/1072; G11C 7/222; G11C 11/4076; H05K 1/181; H05K 2201/10159; H05K 2201/10318
See application file for complete search history.

(56) References Cited

U.S. PATENT DOCUMENTS

| | | | |
|---|---|---|---|
| 8,054,664 B2 * | 11/2011 | Harashima ............. | G11C 5/025 365/230.01 |
| 9,786,354 B2 * | 10/2017 | Seok ................... | G11C 11/4093 |
| 2023/0044892 A1 * | 2/2023 | Li ........................... | H01L 25/18 |

* cited by examiner

*Primary Examiner* — Son L Mai

(74) *Attorney, Agent, or Firm* — GREENBLUM & BERNSTEIN, P.L.C.

(57) ABSTRACT

A memory stick configured for use with a processor in a computer is provided. The memory stick includes a printed circuit board with first and second sides, each of the first and second sides including eighteen memory chips, each of the memory chips being an ×8 DRAM chip; the eighteen memory chips being distributed into first, second, third and fourth rows, the first row and the second row being on a left half of the printed circuit board and the third and fourth row being on a right half of the printed circuit board; and the printed circuit board including at least 400 pins including at least 16 pins for ECC bits and at least 128 pins for data bits; wherein at least the memory chips and the 128 pins for data bits establish a 128-bit data width to communicate.

20 Claims, 11 Drawing Sheets

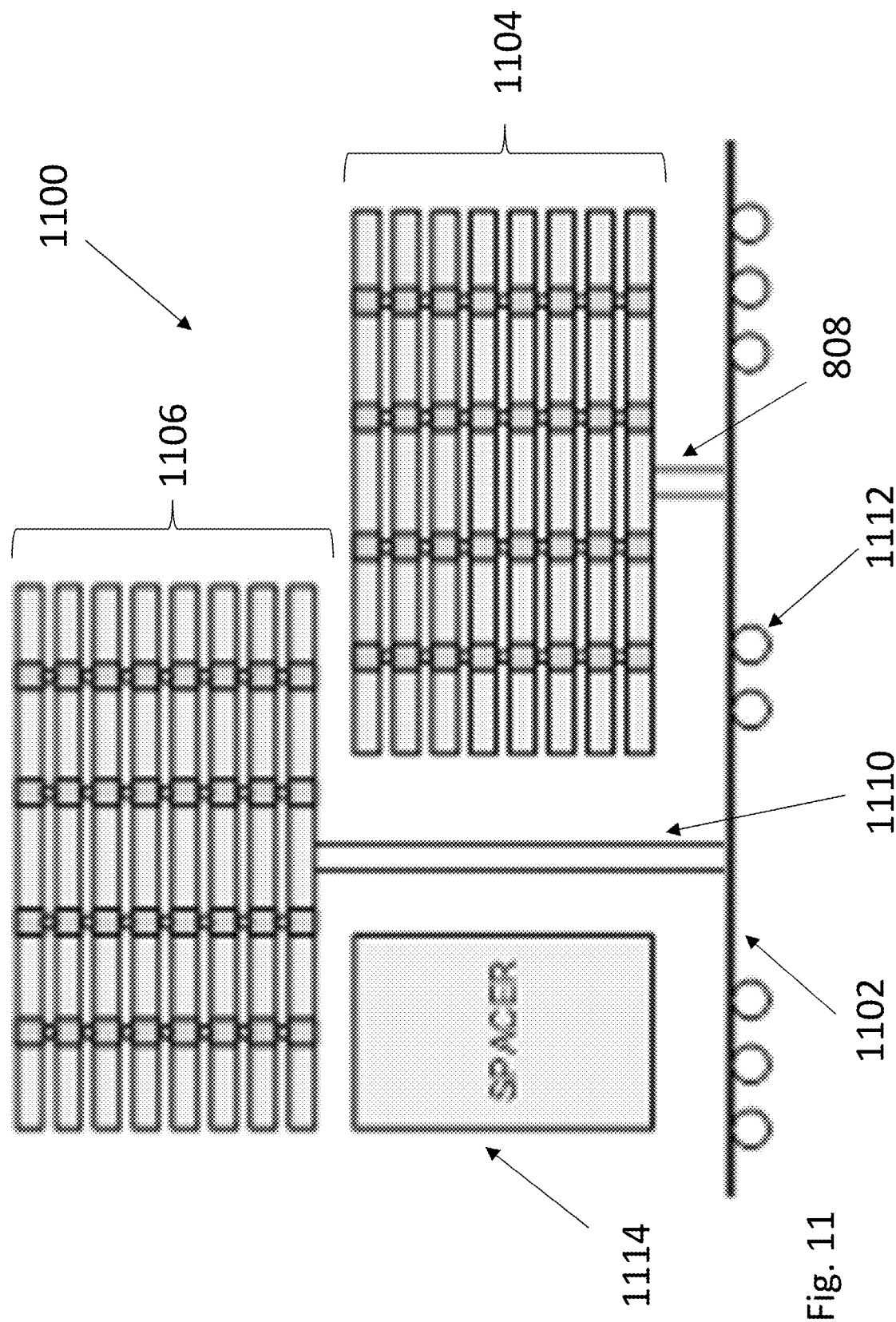

LAYOUT FOR DUAL IN-LINE MEMORY TO SUPPORT 128-BYTE CACHE LINE PROCESSOR

CROSS REFERENCE TO RELATED APPLICATIONS

The instant Application claims priority to U.S. Provisional Application No. 63/270,609, entitled LAYOUT FOR DUAL IN-LINE MEMORY TO SUPPORT 128-BYTE CACHE LINE PROCESSOR, filed Oct. 22, 2021, the contents of which are expressly incorporated herein in its entirety.

FIELD OF THE INVENTION

Various embodiments described herein generally relate to dual in-line memory module (DIMM) with Double Data Rate Synchronous Dynamic Random-Access Memory (DDR SDRAM) chips. More specifically, various embodiments relate to a layout of DDR SDRAM that is able to utilize the improvements found in fifth-generation DDR (DDR5) DIMMs with 128-byte cache line processors.

BACKGROUND

Dynamic random-access memory (DRAM) is a type of semiconductor memory that is typically used for the data or program code needed by a computer processor to function. DRAM is a common type of random-access memory (RAM) that is used in personal computers (PCs), laptops, workstations, and servers. DRAMs are typically provided as integrated circuit chips. DRAM chips currently support data widths of 4 (×4), or 8 (×8), or 16 (×16) bits. Synchronous dynamic random-access memory (SDRAM) is a DRAM where an externally supplied clock signal coordinates the operation of its external pin interface.

A dual in-line memory module (DIMM) is a memory stick with a collection of several SDRAMs populating one or two sides of a printed circuit board (PCB). The stick is plugged into a socket of a computing device (e.g., server, personal computer, laptop, tablet, special purpose device, etc.)

Certain DIMM layouts have been set as standards to permit industry sources to universally manufacture compliant components. Double Data Rate (DDR) is one such standard, which has gone through five generations beginning with the initial DDR circa the year 2000 through the current DDR5 as introduced in 2020. The standards for the DDR5 are established in JESD79-5 ("DDR5 standard") by the JEDEC Solid State Technology Association.

DDR5 DIMMs have significant advantages over DDM4 DIMMs, and are expected to become the dominant DIMM option for the next several years.

DRAWINGS

Various embodiments in accordance with the present disclosure will be described with reference to the drawings, as follows.

DETAILED DESCRIPTION

Figure 1:
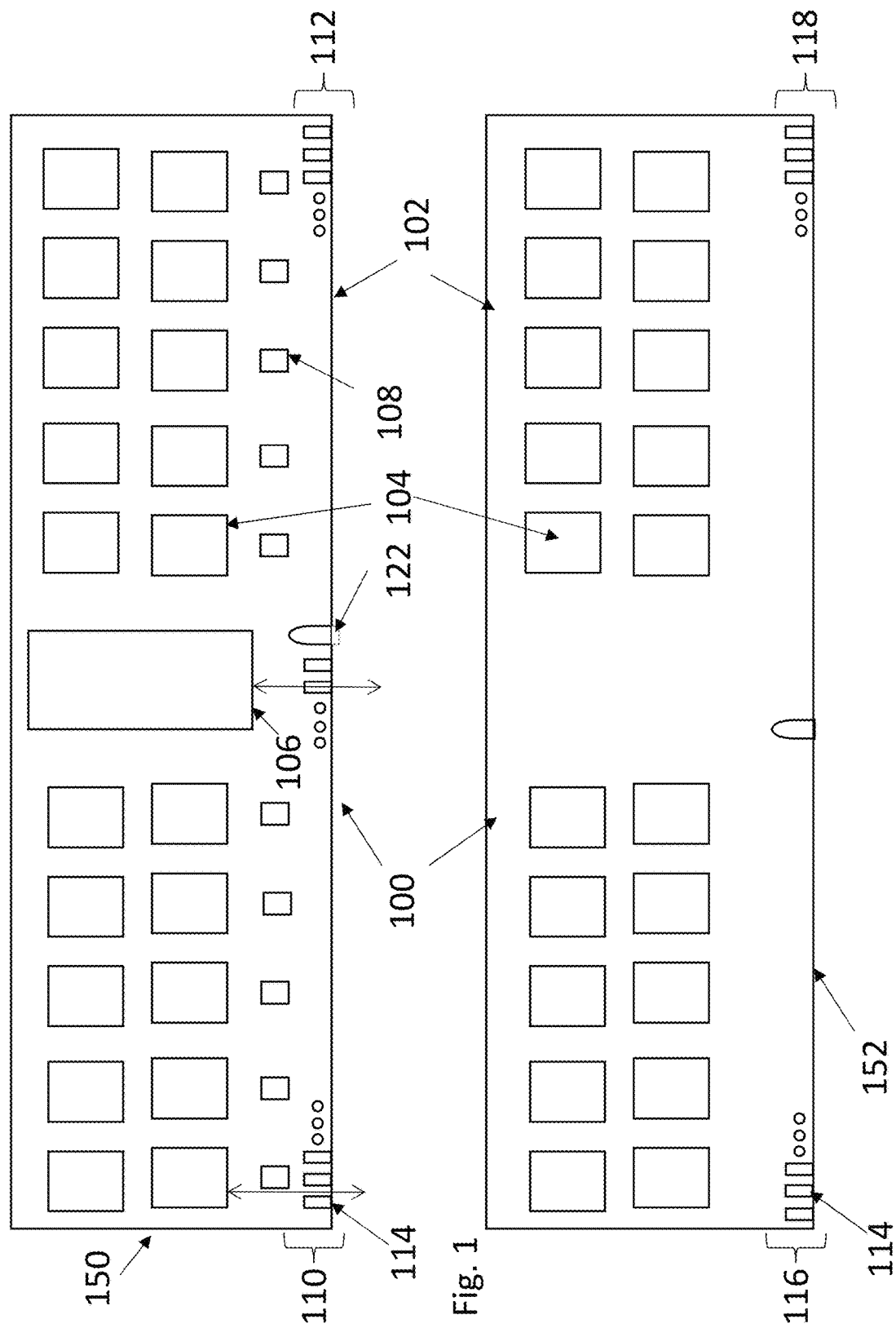
FIG. 1 shows a block diagram of front and back sides of a prior art DDR5 SDRAM stick.

In the following description, various embodiments will be illustrated by way of example and not by way of limitation in the figures of the accompanying drawings. References to various embodiments in this disclosure are not necessarily to the same embodiment, and such references mean at least one. While specific implementations and other details are discussed, it is to be understood that this is done for illustrative purposes only. A person skilled in the relevant art will recognize that other components and configurations may be used without departing from the scope and spirit of the claimed subject matter.

Specific details are provided in the following description to provide a thorough understanding of embodiments. However, it will be understood by one of ordinary skill in the art that embodiments may be practiced without these specific details. For example, systems may be shown in block diagrams so as not to obscure the embodiments in unnecessary detail. In other instances, well-known processes, structures and techniques may be shown without unnecessary detail in order to avoid obscuring example embodiments.

References to one or an embodiment in the present disclosure can be, but not necessarily are, references to the same embodiment; and, such references mean at least one of the embodiments.

References to any "example" herein (e.g., "for example", "an example of", by way of example" or the like) are to be considered non-limiting examples regardless of whether expressly stated or not.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various features are described which may be features for some embodiments but not other embodiments.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Several definitions that apply throughout this disclosure will now be presented. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" when utilized means "including, but not necessarily limited to"; it specifically indicates open-ended inclusion or membership in the so-described combination, group, series and the like. The term "a" means "one or more" unless the context clearly indicates a single element. The term "about" when used in connection with a numerical value means a variation consistent with the range of error in equipment used to measure the values, for which ±5% may be expected. "First," "second," etc., re labels to distinguish components or blocks of otherwise similar names, but does not imply any sequence or numerical limitation. "And/or" for two possibilities means either or both of the stated possibilities ("A and/or B" covers A alone, B alone, or both A and B take together), and when present with three or more stated possibilities means any individual possibility alone, all possibilities taken together, or some combination of possibilities that is less than all of the possibilities. The language in the format "at least one of A . . . and N" where A through N are possibilities means "and/or" for the stated possibilities.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

As used herein, the term "front," "rear," "left," "right," "top" and "bottom" or other terms of direction, orientation, and/or relative position are used for explanation and convenience to refer to certain features of this disclosure. However, these terms are not absolute, and should not be construed as limiting this disclosure.

Shapes as described herein are not considered absolute. As is known in the art, surfaces often have waves, protrusions, holes, recesses, etc. to provide rigidity, strength and functionality. All recitations of shape (e.g., cylindrical) herein are to be considered modified by "substantially" regardless of whether expressly stated in the disclosure or claims, and specifically accounts for variations in the art as noted above.

"Computer" refers to any special purpose or general-purpose device that includes one more processors cooperating with one or more memories to execute programmed functions. The computer may include input devices (e.g., keyboard, mouse), output devices (e.g., display, speaker), communications devices (e.g., a modem, a network card (wireless or wired), an infrared communication device, etc.), and/or other storge (e.g., disk, ROM, RAM). Non-limiting examples of computers include mainframes, servers, cloud computing environments, personal computer workstations (PCs), laptops, tablets, smart displays, mobile phones, or the like. The individual components may be located in the same physical device (e.g., a laptop) or dispersed amongst different devices at different locations.

DDR5 Information

Referring now to FIG. 1, a prior art DDR5 100 load reduced DIMM (LR-DIMM) is shown. A printed circuit board 102 has a front side 150 and a rear side 152. The front side 150 supports twenty (20) ×4 DRAM chips 104, a central registered clock driver (RCD chip) 106, data buffers 108, and left and right pin sets 110 and 112 of individual pins 114 extending along the bottom of printed circuit board 102. The rear side supports 152 twenty (20) ×4 DRAM chips 104 and left and right pin sets 116 and 118 of individual pins 114. A key slot 122 is sized and positioned to mate with a projection of a socket of the supporting architecture (e.g., server, computer) to connect DDR5 100 to the supporting architecture. Other components of DDR 500 per the DDR5 standard as are known in the art (e.g., PMIC, SPD hub, temperature sensor, wiring, connectors, etc.) are not shown.

Figure 2:
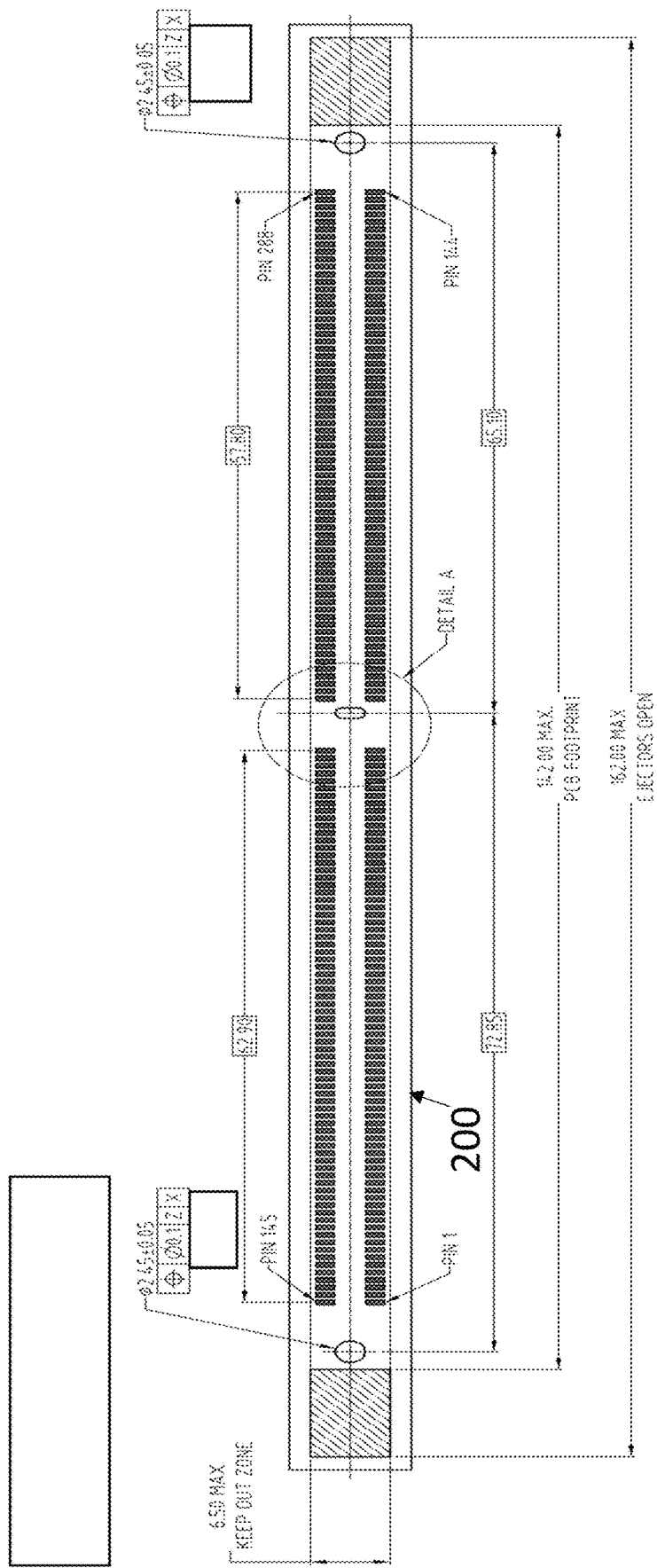
FIG. 2 is a scale bottom view of a prior art DDR5 SDRAM socket for receiving a DDR5 SDRAM stick.

Referring now to FIG. 2, a scale bottom view is shown of a socket 200 for receiving a DDR5 100 and reflects the pinset of the DDR5 100. The DDR5 standard has 144 of pins 114 on both sides of printed circuit board 102, for 288 total pins. Adjacent pins 114 within each pin set 110/112/116/118 are set at a 0.85 mm pitch (center-to-center). Eight (80) of pins 414 carry data signals, including sixteen (16) dedicated to error correction data and sixty-four (64) data bits for processing. The remaining pins 114 are used for a combination of strobe signals, power, ground, and control signals.

DDR5 100 has various features that improve over its DDR4 predecessor. DDR5 100 includes two channels. Each of these channels is forty (40) bits wide: thirty-two (32) data bits with eight ECC bits. The left and right side of the DDR5 100 is each served by an independent 40-bit wide channel and share RCD 106 that provides four output clocks per side. Burst length of sixteen (16) allows a single burst to access sixty-four (64) bytes of data on a four-byte bus, which matches the typical CPU 64-byte cache line. DDR5 DIMMs will have a 12-V power management IC that distributes a 1.1 V supply. Other technical capabilities of DDR5 100 are known in the art and not further discussed herein.

DRAM chips 104 have a rectangular shape with dimensions of approximately 10 mm by 12 mn (short side×long side). Per the DDR5 standard, DRAM chips 104 are aligned at four rows, each row including five DRAM chips 104, where the top rows are slightly offset from the bottom row. Each DRAM chip 104 has its short side aligned with the length of printed circuit board 102, and the long side aligned with the height of printed circuit board 102.

A registered DIMM (R-DIMM) version of DDR5 100 would lack data buffers 108, and an unregistered DIMM (U-DIMM) version would lack RCD chip 106 and data buffers 108.

Per DDR5 standards, printed circuit board 102 of DDR5 100 is 142 mm long. This size is appropriate for use in servers and other large computers that can accommodate that size. Smaller devices such as tablets or laptops use a small outline dual in-line memory module (SO-DIMM t). Per the DDR4 SO-DIMM standard, the printed circuit board is 69.6 mm long, which is roughly half the length of printed circuit board 102 of DDR5 100 (DDR5 SO-DIMM standards on length have not been set). Due to the smaller length, the SO-DIMM has fewer DRAM memory chips than an LR-DIMM, and supports 260 pins. This 260-pin count is too high relative to the 69.5 mm length of the SO-DIMM to meet the 0.85 pin pitch of DDR5 standard, and thus uses a different standard of 0.50 mm. The smaller pin pitch imposes higher precision requirements in manufacture of both the SO-DIMM and a corresponding socket, which increases the difficulty of manufacture and corresponding costs.

Command and control, wiring layout, and other physical components of DDR5 100 as are known in the art and not specifically discussed herein. Non-limiting examples of the same include: Schlachter, *Introducing Micro DDR5 SDRAM: More than a Generational Update; DDR5 SDRAM RDIMM based on 16Gb M-die*; and Micron DD: *Key Module Features*. The subject matter of the foregoing are incorporated herein by reference in their entireties.

Figure 3:
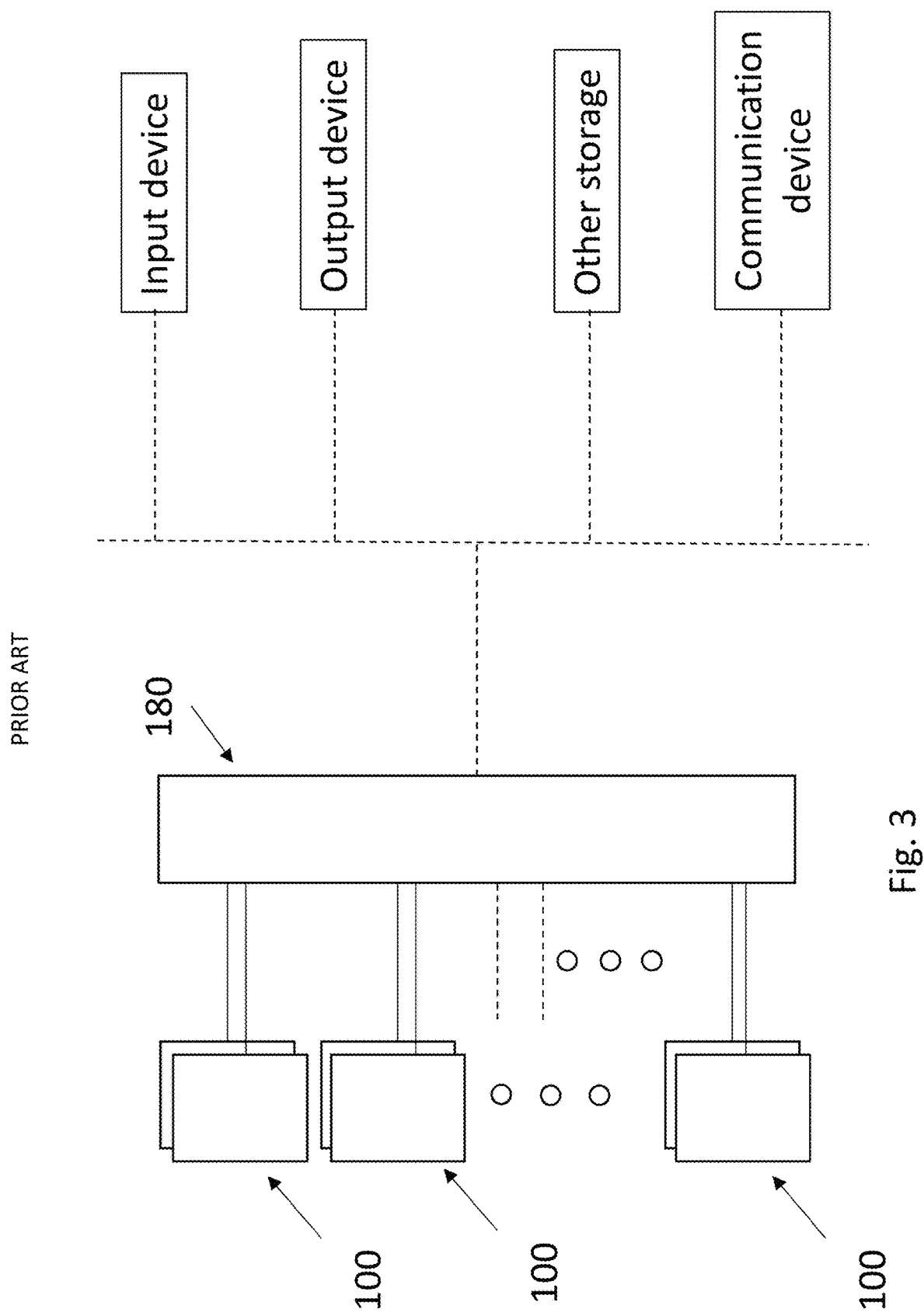
FIG. 3 is a block diagram of one or more prior art DDR5 SDRAM sticks connecting with one or more prior art processors.

Referring now to FIG. 3, DDR5 100 is shown in a computer operating environment. One or more DDR5 100 connect via sockets (not shown) to one or more processors 180, which may be located in the same physical device or dispersed amongst different devices at different locations.

Processors 180 are typical commercial processors, such as the INTEL Xeon-Broadwell, Xeon-Skylake, Xeon-Cascade Lake, and have a 64-byte cache line. As noted above, the 64-byte cache line of processor 180 is a perfect match for the 32-bit data channel width (non-ECC) of DDR5 100. The 32-bit data channel width of DDR5 100 thus supports the 64-byte data cache line of the prior art processor 180.

Modified DIMM for 128-Byte Cache Line Processor

Applicants have developed a new processer, and example of which is set forth in Applicants' U.S. Pat. No. 10,915,324, which can operate at clock speeds that are multiples of clock speeds for current processors such as processor 180. This faster processer can utilize a 128-byte cache line that is at least twice as fast as prior art processor 180.

Unfortunately, the 32-bit data channel width of DDR5 100 will not fully support a 128-byte cache line processor. The 32-bit data channel width of DDR5 100 would act as bottleneck relative to the 128-byte cache line, utilizing only half of the available cache-line of the processor.

Figure 4:
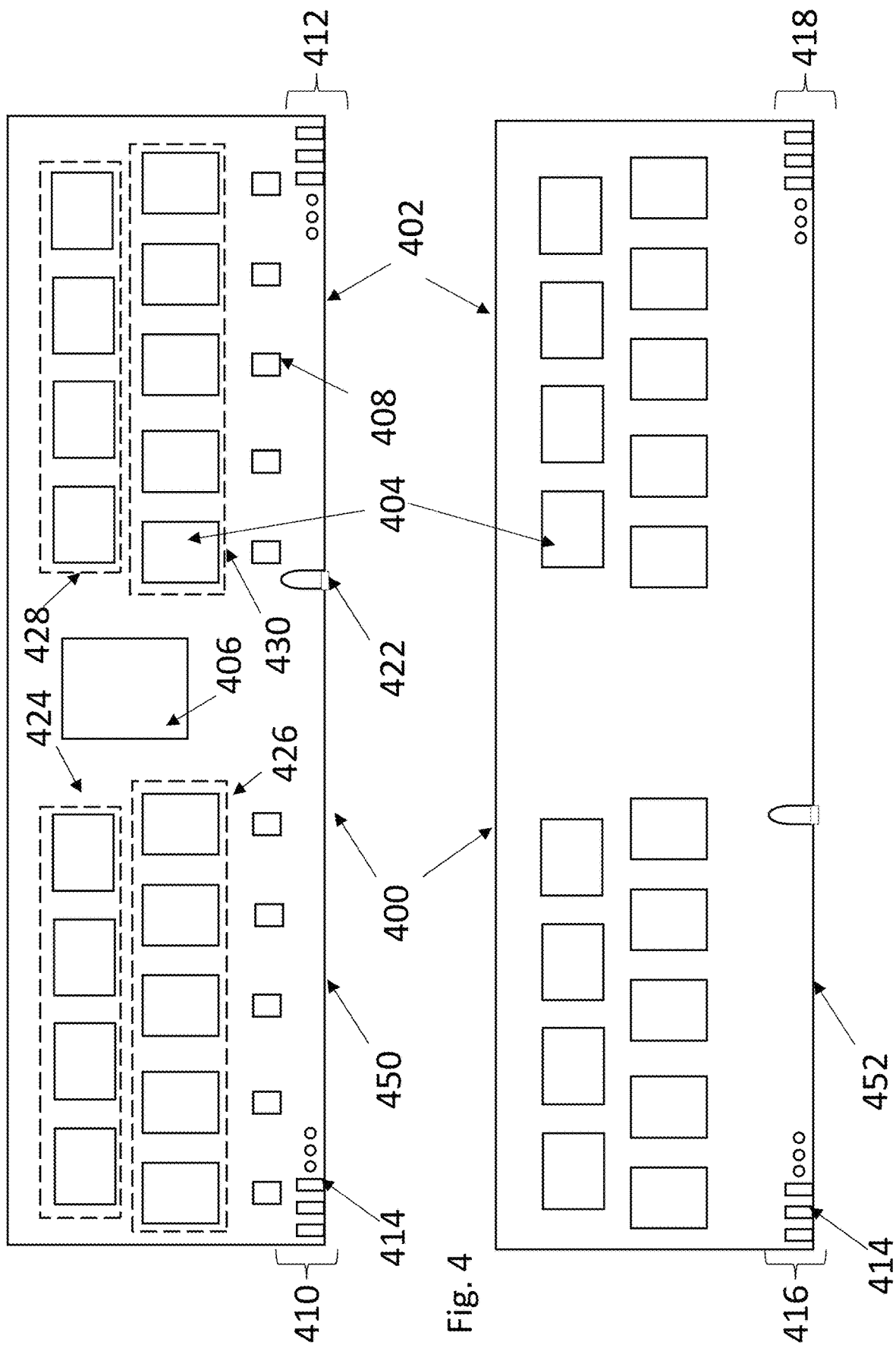
FIG. 4 shows a block diagram of front and back sides of a memory stick according to an embodiment of the invention.

Referring now to FIG. 4, a memory stick 400 LR DIMM is shown. Memory stick 400 is a modified version of DDR5 100, with specific modifications that allow memory stick 400 to operate with a 128-byte cache line processor while still receiving the benefits of a DDR5 DIMM.

To that end, memory stick 400 may have the same components, wiring, and functionality as set forth in the DDR5 standard and commercial DDR5 100 sticks other than as (a) modified herein or (b) as needed to account for the express modifications. By way of non-limiting example, (a) memory stick 400 may use ×8 DRAM chips instead of ×4 DRAM chips of DDR5 100, and (b) will have additional pins, wiring pathways, and command and control functionality to account for the same. Despite these modifications, memory stick 400 may maintain functions of the DDR5 standard (e.g., two channels, memory chips on left and right side of the memory stick 400 share an RCD that provides four output clocks per side, burst length of sixteen (16), a 12-V power management IC that distributes a 1.1 V supply, corresponding command and control, and other technical capabilities of DDR5 100 are known in the art and not further discussed herein.). Similarly, memory stick 400 includes the supporting components (e.g., PMIC, SPD hub, temperature sensor, wiring, connectors, etc.).

Command and control for memory stick 400 may be the same as known for DDR5 100, save for modification to account for fewer memory chips (eighteen instead of twenty), the presence of additional data bits (128 instead of 64), and other corresponding wire/pins with signals for the ×8 memory chips 404.

Memory stick 400 provides an option to leverage commercially available components and conform to accepted DDR5 standards and/or industry norms (other common industry activity that is not strictly defined by the published DDR5 standards) when desirable. Custom components, while viable and included within the scope of the invention, may require significant alterations to related industry components, which would present a barrier to their adoption. By way of non-limiting example, server trays are sized to receive DDR5 100 inserts that are 142 mm long. Designing a DIMM with a longer length may provide increased capabilities but may not fit within the existing allocated area and would require a redesign of the server tray for future implementations.

Memory stick 400 includes a printed circuit board 402 with a front side 450 and a rear side 452. The front side 450 supports eighteen (18) ×8 error correction code (ECC) memory chips 404 (which by way of non-limiting example may be SDRAM or DRAM chips), a central registered clock driver (RCD) 406, data buffers 408, and left and right pin sets 410 and 412 of individual pins 414 extending along the bottom of printed circuit board 402. The rear side supports 452 eighteen (18) ×8 error correction code (ECC) memory chips 404, and left and right pin sets 416 and 418 of individual pins 414.

A key slot 422 is sized and positioned to mate with a projection of a socket (not shown) to the supporting architecture (e.g., server, computer) to connect memory stick 400 to the supporting architecture. Key slot 422 is located in a different position from key slot 122 of DDR5 100 so that memory stick 400 would not be inserted into a socket for a DDR5 100, and vice-versa.

Memory chips 404 have a rectangular shape with dimensions of approximately 10 mm×12 mm (short side×long side). Memory chips 404 are positioned in four rows 424, 426, 428, and 430. Rows 424 and 426 are to the left of RCD chip 406, while rows 428 and 430 are to the right of RCD chip 306. Rows 426 and 430 include five (5) memory chips 404, each having its short side aligned with the length of printed circuit board 402, and the long side aligned with the height of printed circuit board 402; memory chips 404 in rows 424 and 428 are aligned perpendicular to those in rows 426 and 420. Rows 424 and 428 include four (4) memory chips 404, each having its long side aligned with the length of printed circuit board 402, and the short side aligned with the height of printed circuit board 402. Memory chips 404 in rows 424 and 428 are horizontally aligned (same height above the bottom of PCB 402), and memory chips in rows 426 and 430 are horizontally aligned.

Pins set 410/412/416/418 collectively provide a total of 400-550 pins 414 for memory stick 400. More pins may be added if additional functionality is desired and additional components are added to support the same, and fewer pins may be used if less functionality is desired or components are removed. The pins 414 include pins for 128 data bits and sixteen (16) error correction bits. The remaining pins 414 are used for a combination of strobe signals, power, ground, and control signals.

Figure 5:
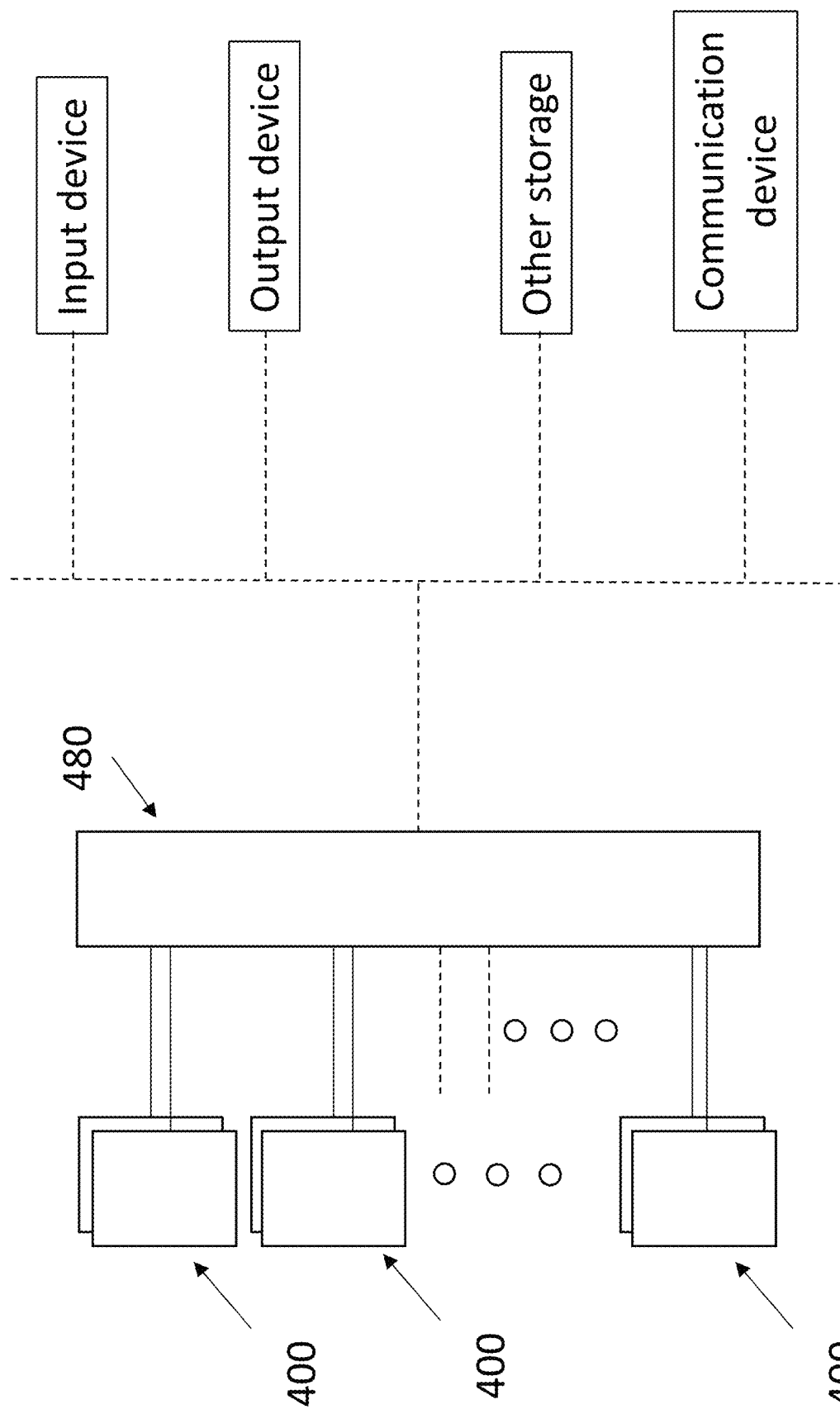
FIG. 5 is a block diagram of one or more memory sticks of FIG. 4 connecting with one or more processors.

Referring now to FIG. 5, memory stick 400 is shown in a computer operating environment. One or more memory sticks 400 connect via sockets (not shown) to one or more processors 480, which may be located in the same physical device or dispersed amongst different devices at different locations. Processors 180 have a 128-byte cache line. The 128-byte cache line of processor 480 is a perfect match for the 64-bit data channel width (non-ECC) of memory stick 400. The 64-bit data channel width of memory stick 400 thus supports the maximum 128-byte data cache line of processor 480. Memory sticks 400 and/or one or more processors 480 are programmed to communicate and cooperate through established protocols (modified as needed to account for their particulars as discussed herein) to perform programmed operations (either alone or in conjunction with other components and/or data) as is known in the art and not further discussed herein. Other common computer components may be present, such as input devices (e.g., keyboard, mouse), output devices (e.g., display, speaker), and/or other storge (e.g., disk, ROM, other RAM). The invention is not limited to any particular operating environment.

A principal advantage of memory stick 400 is that it has twice the data rate bandwidth compared to the prior art DDR5 100, and can thus fully support a 128-byte cache line processor while DDR5 100 can only fully support a 64-byte cache line processor. Specifically, the twenty ×4 memory chips of DDR5 100 have sixty-four (64) data bit pins and provides bandwidth that at best can fully support 64-byte data cache line processor 180. For memory stick 400, the eighteen ×8 memory chips provide 128 data bit pins that can fully support a 128-byte cache line processor as processor 480. As noted above, DDR5 100 would limit a 128-byte cache line processor to half of its throughput.

A tradeoff for the advantages of memory stick 400 relative to DDR5 100 is difficulties in construction and deviation from mechanical aspects of the DDR5 standard.

One such deviation is the pin count. The low end of approximately 400 total pins 414 of memory stick 400 exceeds the 288-pin count of DDR5 100, and thus deviates from the DDR5 standard on this basis. Memory stick 400 is therefore not compatible with existing sockets for DDR5 100.

The minimum number of pins 414 of memory stick 400 also will not fit in a 142 mm long printed circuit board at a 0.85 pin pitch per the DDR5 standard. Accommodating this higher number of pins requires a longer printed circuit board and/or a different pin pitch, which presents either one or two further deviations from the DDR5 standard.

According to an embodiment, memory stick 400 may retain compliance with the printed circuit board size aspects of the DDR5 standard. This compliance can be retained because the layout of memory chips 404 occupies nearly the same area as DRAM chips 104 of DDR5 100, with comparable length and a slightly smaller height. Memory stick 400 may thus use the same sized printed circuit board as suitable for use in DDR5 100, thus retaining compliance with that aspect of the DDR5 standard. Non-limiting example of such circuit boards are SAMSUNG RDIMM P/N: M321R2GA3BB0 (16 GB) and M321R4GA3BB0 (32 GB). However, the invention is not limited, and any size or source of printed circuit board may be used.

Retaining compliance with the DDR5 standard size for the printed circuit boards requires deviation from the 0.85 pin pitch of the DDR5 standard. Pure mechanically driven selection of a smaller pitch size would require establishment of an entirely new standard and development of supporting architecture. However, a 0.50 mm pin pitch will meet the layout requirements and has the added benefit of being part of the existing DDR4 SO-DIMM standard for which there is existing body of industry knowledge in construction of components (e.g., pins, connections, and sockets) to that pitch size. However, the invention is not so limited, and any size pin pitch may be used. Pin pitch is preferably uniform, but may be different on different portions of memory stick 400.

The above changes also contribute to mechanical difficulties in the construction of memory stick 400 as compared to DDR5 100. As pin pitch decreases, the need for precision manufacturing increases to account for the smaller gap space between pins relative to allowable manufacturing tolerances. As is known in the art, manufacturing of both the pins and the sockets for SO-DIMMs at 0.50 mm pin pitch is more difficult and expensive than DIMMs at a 0.85 mm pitch.

Another manufacturing obstacle is the additional number of data pathways to connect the ×8 chips with the higher number of pins. Memory stick 400 has more data pathways and connections than DDR5 100. As those additional data pathways and connections occur in the same physical footprint, the data pathways and connections of memory stick 400 may need to be smaller than those of DDR5 100, which again requires more precision manufacturing.

In theory, memory stick 400 can be used with a slower processor such as 64-byte cache line processor 180. However, for the reasons noted above, memory stick 400 would not provide any meaningful improvement in throughput of processor 180, as processor 180 could only leverage half the data width of memory stick 400. That combination thus has all of the above-noted disadvantages without the above-noted advantages.

Memory chips 404 may be any commercial ×8 memory that will operate in the manner discussed herein. A non-limiting example is SAMSUNG DDR5 device P/N: K4RAH08. However, the invention is not so limited, and any ×8 memory chip that supports the environment may be used.

RCD chip 406 may be any commercial RCD chip that supports the DDR5 standard and which would provide sufficient clock speed to drive the memory chips 404. A non-limiting example is RENEAS RCD P/N: 5RCD0148HC. However, the invention is not so limited, and any RCD chip that supports the environment may be used.

Data buffers 408 may be ×8, in numbers and positions as needed to support the memory chips 404. A non-limiting example is RENEAS DB P/N: 5DB0148HAOAVG. However, other size data buffers (e.g., ×4), in corresponding numbers and positions as needed, may also be used.

Memory stick 400 of the above embodiment is an LR-DIMM. However, the invention is not so limited. An RDIMM version would lack data buffers 408, and a U DIMM version would lack RCD chip 406 and data buffers 408. Other DIMM orientations may also be used.

The layout of rows 424-430 in FIG. 4 is exemplary. However, the invention is not so limited, and other layouts could be used. By way of non-limiting example, rows 426 and 430 could be the top rows, or one could be the top while the other could be the bottom. In theory, rows 424 and 428 could be on the same side (left or right) with rows 426 and 430 on the other side, although this may sacrifice symmetry of control and/or data flow. The orientation may be the same on front side 450 and rear side 452, or different on each side.

The organization and orientation of memory chips 404 in rows 424-430 is also exemplary. However, the invention is not so limited, and other organizations and/or orientations could be used. By way of non-limiting example, all memory chips 404 could be oriented with their short side parallel to the bottom of printed circuit board 402. In another example, the memory chips could be laid with their long side parallel to the bottom of printed circuit board 402, although this may require a longer printed circuit board to adapt. The invention is not limited to any placement of individual memory chips 404.

The embodiment of memory stick 400 as described herein is a modified version of DDR5 100. However, the invention is not so limited. Designs are not static, and DDR5 100 may evolve within its generation (either in the DDR5 standard or by industry practices that do not amount to a standard). By way of non-limiting example, DDR5 has a 4.8 Gbps per second (Gbps) at a clock rate of 1.6 gigahertz (GHz) and is expected in the future to increase to 6.4 Gbps at a clock rate of 3.2 GHz. Memory stick 400 is similarly scalable to incorporate these advancements.

Figure 6:
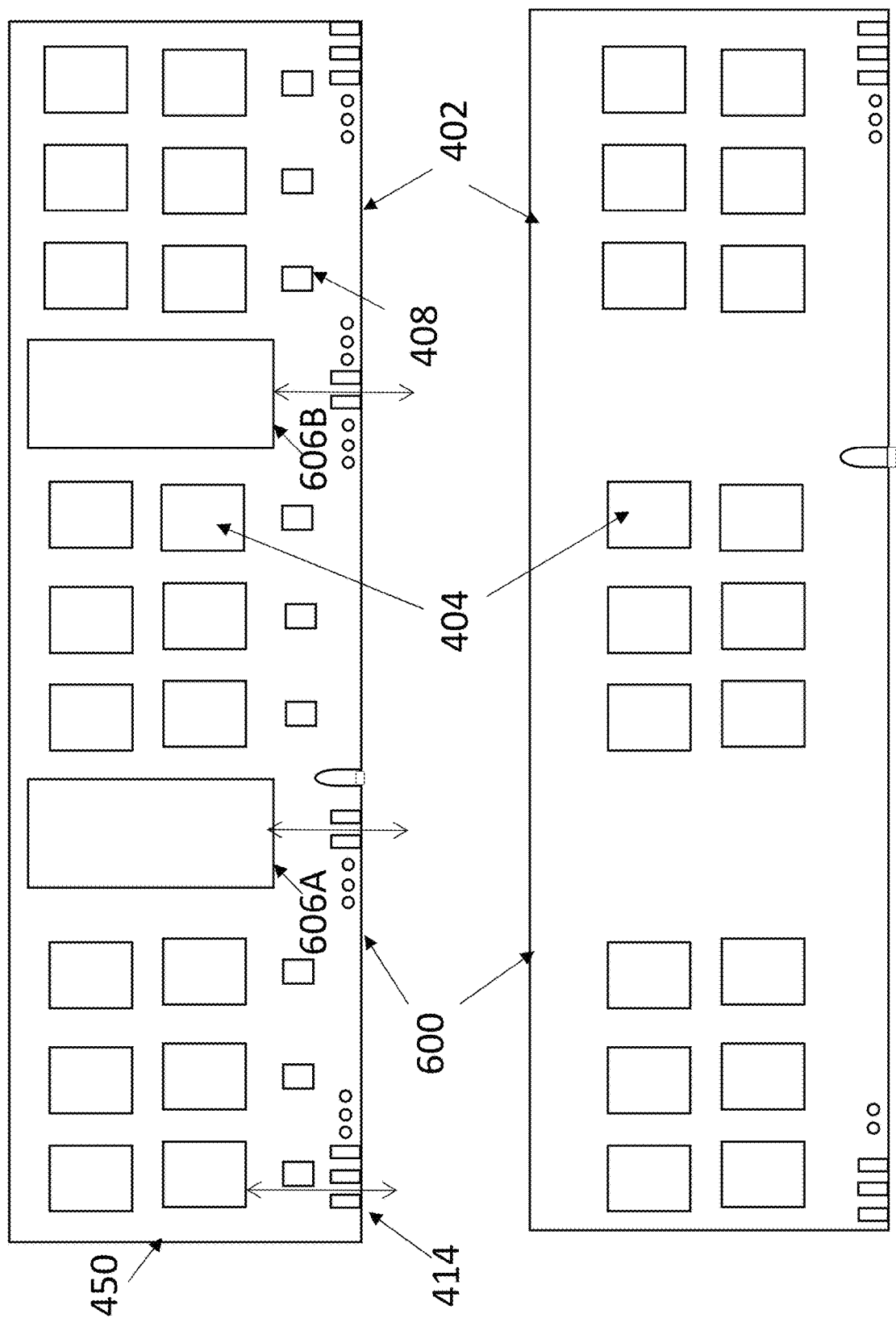
FIG. 6 shows a block diagram of front and back sides of a memory stick according to another embodiment of the invention.

Referring now to FIG. 6, an embodiment of a memory stick 600 is shown. In this embodiment, the eighteen ×8 memory chips 404 on each side of printed circuit board 402 are organized into thirds (six memory chips 404) rather than halves (9 memory chips). Each third is its own channel, such that memory stick 600 has three independent channels rather than two of memory stick 400. RCD chip 606A can generate the clock and command signals for the left and center groups, while RCB chip 606B can generate the clock and command signals for the right groups; although the invention is not limited thereto, and other clock/command signal organizations could be used. Memory stick 600 otherwise follows the same structure and principles as set forth above form memory stick 400.

Memory chip 404 may be any memory chip as operable in a DDR5 environment. Below are some examples for the same.

Figure 7:
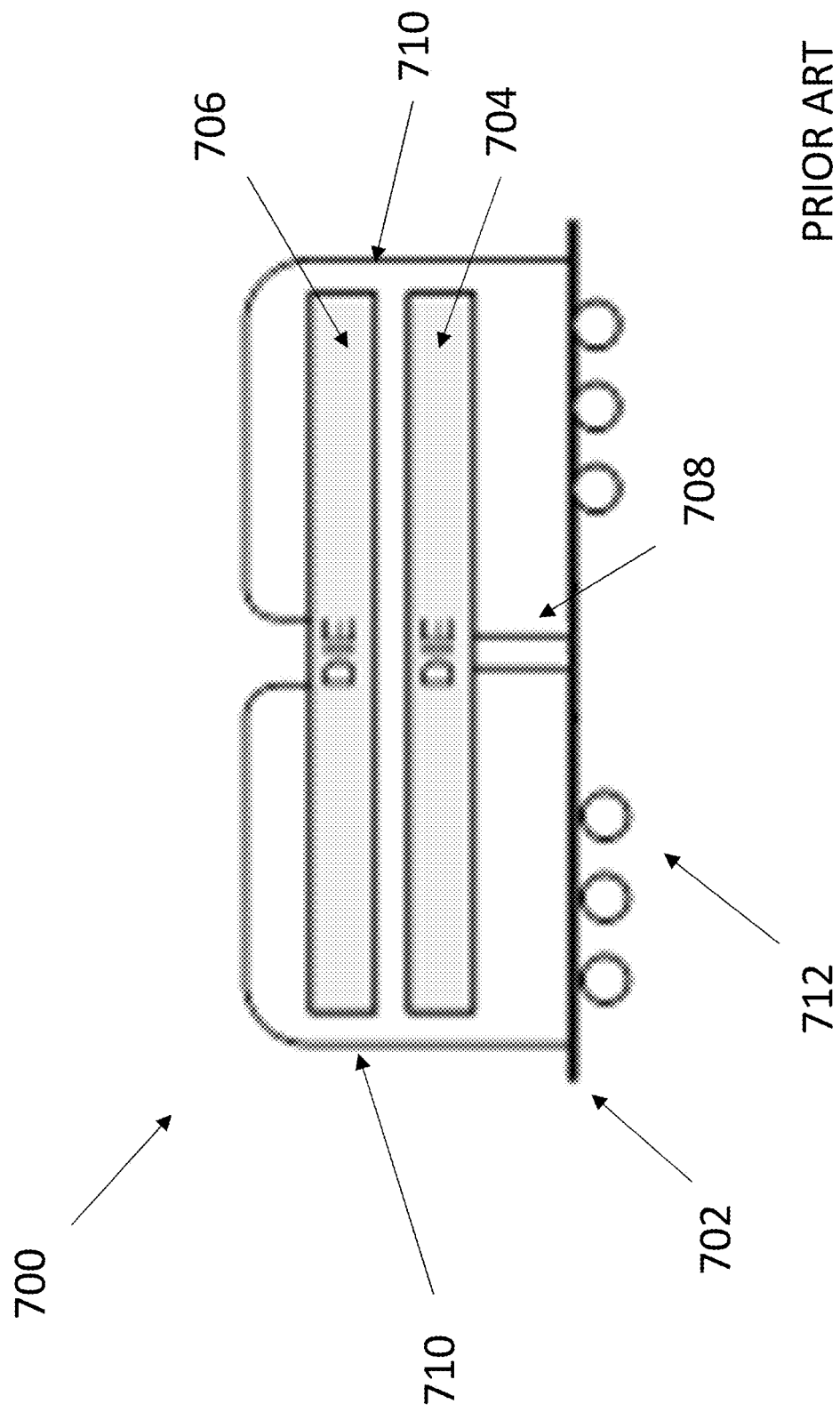
FIG. 7 shows the internal organization of a prior art memory chip.

FIG. 7 shows the internal organization of a memory chip 700 with dual (two) dies for a DDR4 environment. Memory chip 700 includes a substrate 702, a lower die 704, and an upper die 706. Wires 708 extend from substrate 702 to the bottom side of lower die 704, which memory chip 700 accommodates because substrate 702 faces the bottom side of lower die 704. Upper die 706 does not have a side that directly faces substrate 702, and thus connected to substrate 702 by wires 710 that extend from substrate 702 along the sides of dies 704/706 and over the top of upper die 706, and then connect to the surface of an upper side of upper die 706. Package balls 712 on the underside of memory chip 700 acts external connectors to connect external components to memory chip 700.

The configuration of memory chip 700 may not be appropriate for a DDR5 environment. The length of wires 708 is a factor in the effectiveness of the upper die 706, wires 708 may need be too long for a DDR5 compliant version of memory chip 700. Even if DDR5 compliant, speed limitations may undesirably offset other speed gains from technologies.

Figure 8:
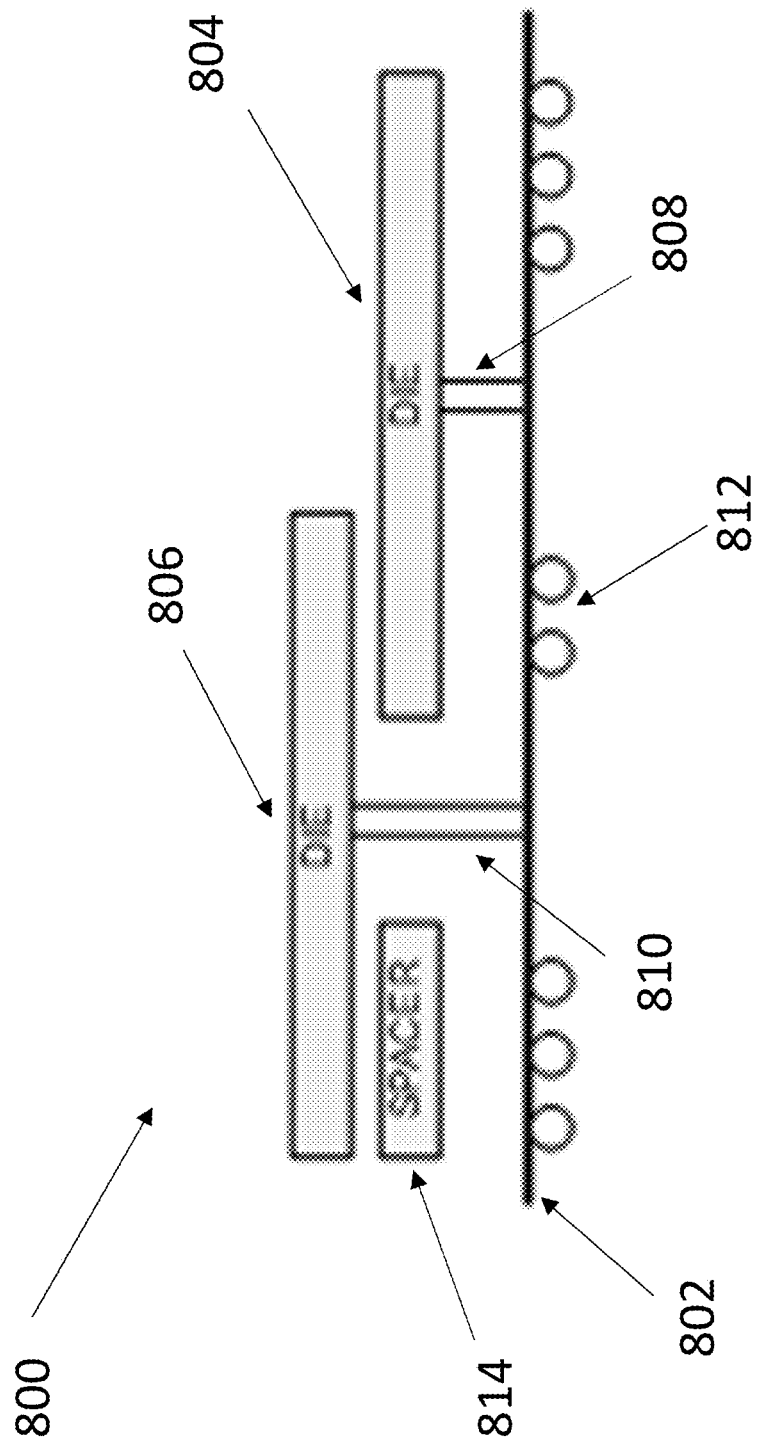
FIG. 8 shows a memory chip according to an embodiment of the invention.

Referring now to FIG. 8, the internal organization of a memory chip 800 according to an embodiment of the invention is shown is shown. Memory chip 800 is a DDR5 compliant version of memory chip 700. Memory chip 800 includes a substrate 802, a lower die 804, an upper die 806, and package balls 812. Upper die 806 is latterly offset from lower die 804 with a portion supported by a spacer 814 (e.g., a ceramic plate), such that a portion of the bottom side of lower die 806 faces substrate 802. Wires 808 extend from substrate 802 to the bottom side of lower die 704. Similarly, wires 810 extend from substrate 802 to the bottom side of upper die 706.

By laterally offsetting upper die 806 relative to lower die 804, wires 810 are shorter than wires 710 of memory chip 700 and thus do not have the drawbacks of long length and allow for use in a DDR5 environment.

Figure 9:
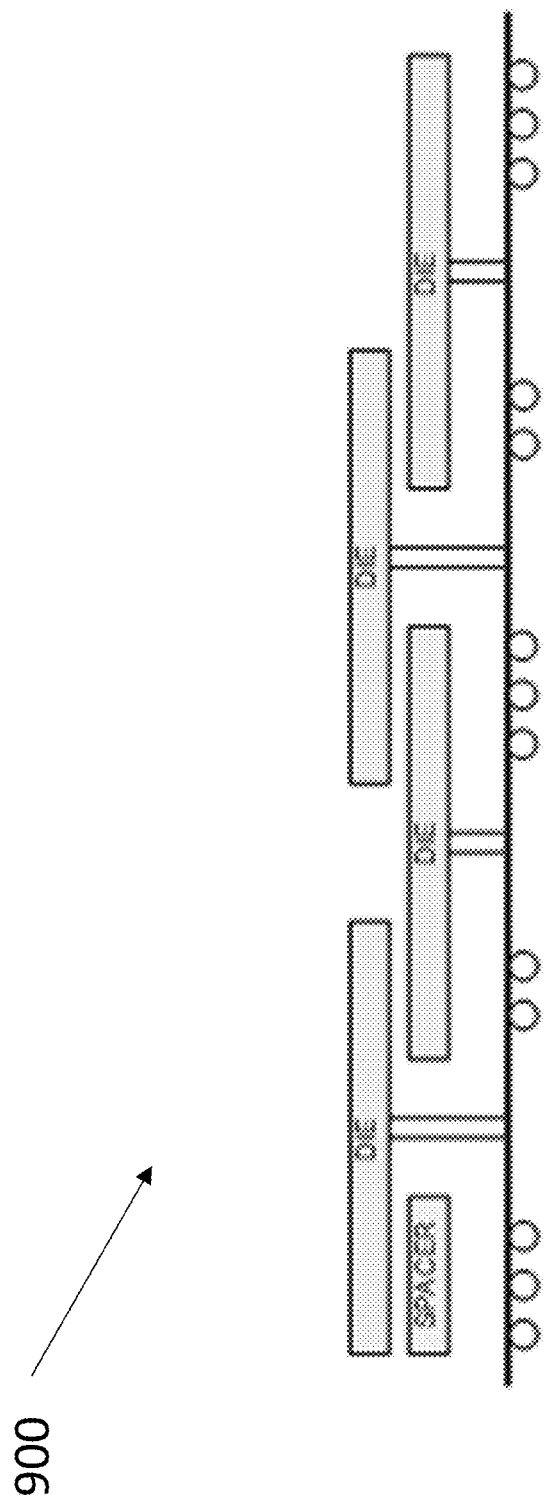
FIG. 9 shows a memory chip according to an embodiment of the invention.

The offset approach can be used with three, four, or more dies. Referring now to FIG. 9, the internal organization memory chip 900 according to an embodiment of the invention is shown. Memory chip 900 is a quad (four) die version of memory chip 800.

Figure 10:
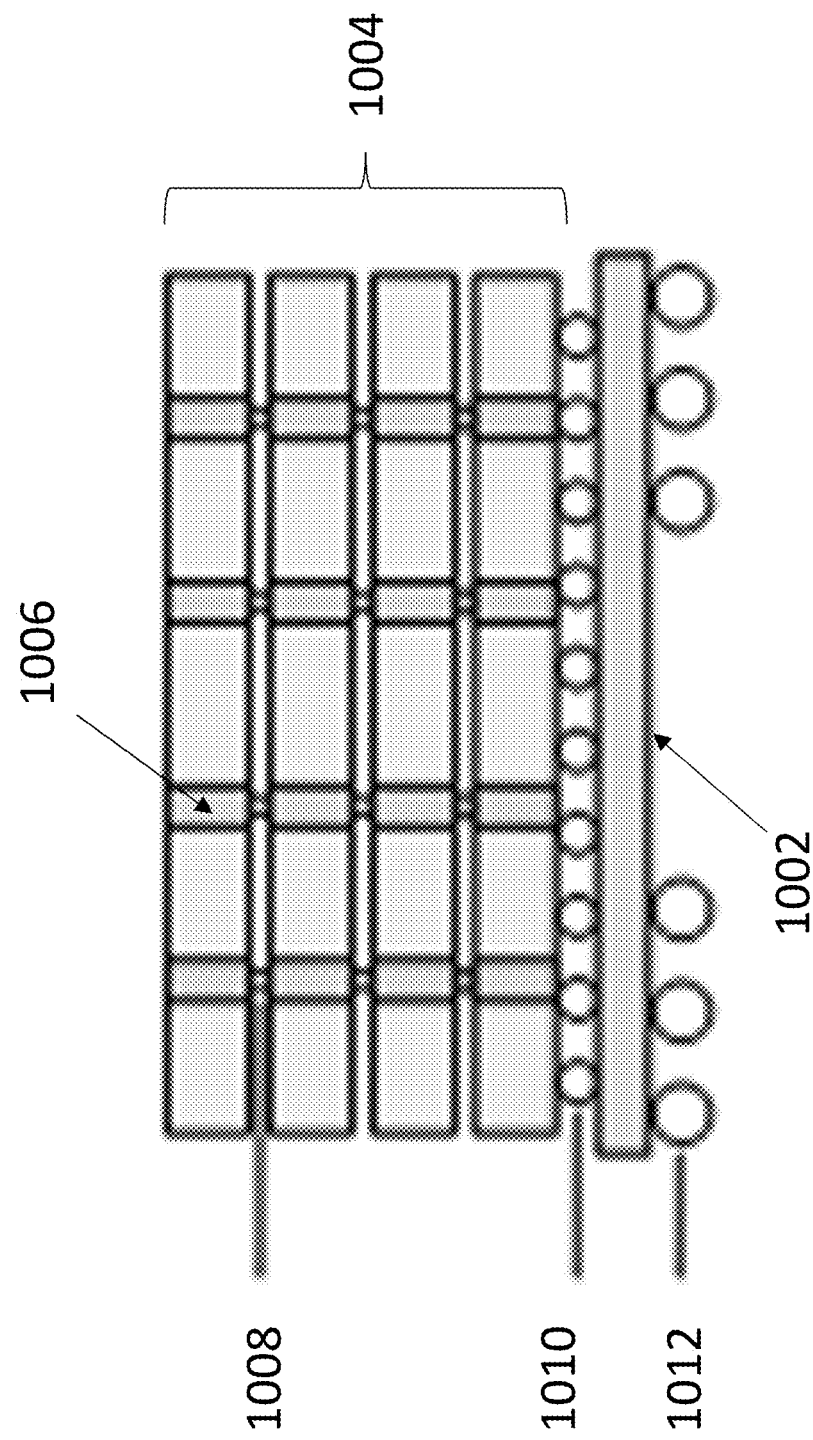
FIG. 10 shows the internal organization of a prior art memory chip.

Referring now to FIG. 10, the internal organization of a prior art memory chip 1000 is shown. A stack of dies 1004 are interconnected using Through Silicon Vias (TSV) 1006 connected by micro balls 1008. The lowest die 1004 is connected to substrate 1002 by flip-chip bumps 1010. FIG. 10 shows a Quad die package, although the invention is not so limited, as dual die, octal die, 16 die, and other packages are possible with this technology.

Referring now to FIG. 11, the internal organization of a memory chip 1100 according to an embodiment of the invention is shown. Memory chip 1100 includes a substrate 1102, a lower die stack 1104, an upper die stack 1104, and package balls 1112. Upper die stack 1106 is latterly offset from lower die 804 with a portion supported by a spacer 1114 (e.g., a ceramic plate), such that a portion of the bottom side of the lowest die in lower die stack 1106 faces substrate 802. Wires 1108 extend from substrate 1102 to the bottom side of lower die stack 1104. Similarly, wires 1110 extend from substrate 1102 to the bottom side of upper die stack 1106.

The above embodiments are generally directed to a printed circuit board including 16 pins for ECC bits and 128 pins for data bits. However, the invention is not so limited, and other pin counts can be used. By way of non-limiting example, 8, 24 or 32 ECC bits could be used with a corresponding pin set.

The discussion of pins and amounts thereof herein are specific to the pins needed to receive appropriate signals. However, the invention is not so limited. Multiple pins may receive the same signal if desired. By way of simplest example, 128 data pins may be provided for 128 data bits, but 129 pins could be provided for 128 data bits with one bit received at two different pins.

According to another embodiment of the invention, rather than ECC bits, error detecting code (EDC) bits could be used. In this embodiment, the number of EDC bits would be eight rather than 16, but the invention is not limited to the number of EDC bits. The DDR5 chip would operate as described herein, other than as necessary to handle EDC rather than ECC.

General Computer Architecture

Various embodiments discussed or suggested herein can be implemented in a wide variety of operating environments, which in some cases can include one or more user computers, computing devices, or processing devices which can be used to operate any of a number of applications. User or client devices can include any of a number of general-purpose individual computers, such as desktop or laptop computers running a standard operating system, as well as cellular, wireless, and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially available protocols, such as TCP/IP, OSI, FTP, UPnP, NFS, CIFS, and AppleTalk. The network can be, for example, a local area network, a wide-area network, a virtual private network, the Internet, an intranet, an extranet, a public switched telephone network, an infrared network, a wireless network, and any combination thereof.

In embodiments where the computing device includes a Web server, the Web server can run any of a variety of server or mid-tier applications, including HTTP servers, FTP servers, CGI servers, data servers, Java servers, and business application servers. The server(s) also may be capable of executing programs or scripts in response requests from user devices, such as by executing one or more Web applications that may be implemented as one or more scripts or programs written in any programming language, such as Java®, C, C# or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen, or keypad), and at least one output device (e.g., a display device, printer, or speaker). Such a system may also include one or more storage devices, such as disk drives, optic storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above.

For example, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, EEPROM, flash memory or other memory technology, CD-ROM, digital versatile disk (DVD) or other optic storage, magnetic cassettes, magnetic tape, magnetic disk storage or other magnetic storage devices, or any other medium which can be used to store the desired information and which can be accessed by a system device. Based on the disclosure and teachings provided herein, an individual of ordinary skill in the art will appreciate other ways and/or methods to implement the various embodiments.

The specification and drawings are to be regarded in an illustrative rather than a restrictive sense. It will, however, be evident that various modifications and changes may be made thereunto without departing from the broader spirit and scope of the invention as set forth in the claims.

What is claimed is:

1. A memory stick configured for use with a processor in a computer, comprising:
   a printed circuit board with first and second sides, each of the first and second sides including:
   eighteen memory chips, each of the memory chips being an x8 DRAM chip;
   the eighteen memory chips being distributed into first, second, third and fourth rows, the first row and the second row being on a left half of the printed circuit board and the third and fourth row being on a right half of the printed circuit board; and
   the printed circuit board including at least 400 pins including at least 16 pins for ECC bits and at least 128 pins for data bits;
   wherein at least the memory chips and the 128 pins for data bits establish a 128-bit data width to communicate.

2. The memory stick of claim 1, wherein:
   the first row of the first side of the printed circuit board has four of the eighteen memory chips; and
   the third row of the first side of printed circuit board has four of the eighteen memory chips.

3. The memory stick of claim 1, further comprising:
   each of the eighteen memory chips have a substantially rectangular shape;
   the memory chips in the first and third rows on the first side of the printed circuit board have their long side aligned in a first direction; and
   the memory chips in the second and fourth rows the first side of the printed circuit board have their long side aligned in a second direction, the first direction being perpendicular to the second direction.

4. The memory stick of claim 2, further comprising the second row on the first side of the printed circuit board is horizontally aligned with the fourth row on the first side of the printed circuit board.

5. The memory stick of claim 1, wherein the at least x pins are distributed into four groups, the pins within each group having a pin pitch of less than 0.85 mm.

6. The memory stick of claim 5, wherein the pin pitch is 0.5 mm.

7. The memory stick of claim 1, further comprising an RCD chip on the first side of the printed circuit board and configured to provide four independent clock signals, including:
 a first clock signal to the memory chips on the left half of the first side of the printed circuit board;
 a second clock signal to the memory chips on the right half of the first side of the printed circuit board;
 a third clock signal to the memory chips on the left half of the second side of the printed circuit board; and
 a fourth clock signal to the memory chips on the right half of the second side of the printed circuit board.

8. The memory stick of claim 7, further comprising a plurality of data buffers.

9. The memory stick of claim 1, further comprising:
 the memory chips on the left half of the first side of the printed circuit board is part of a first channel; and
 a second clock signal to the memory chips on the right half of the first side of the printed circuit board is part of a second channel different from the first channel.

10. The memory stick of claim 1, wherein the 128-bit data width comprises two 64-bit data width channels.

11. A computer, comprising:
 at least one processor programmed to cooperate with at least one memory stick to perform programmed operations;
 each memory stick comprising a printed circuit board with first and second sides, each of the first and second sides including:
  eighteen memory chips, each of the memory chips being an ×8 DRAM chip;
  the eighteen memory chips being distributed into first, second, third and fourth rows, the first row and the second row being on a left half of the printed circuit board and the third and fourth row being on a right half of the printed circuit board; and
 the printed circuit board including at least 400 pins including at least 16 pins for ECC bits and at least 128 pins for data bits;
 wherein at least the memory chips and the 128 pins for data bits establish a 128-bit data width to communicate.

12. The computer of claim 11, wherein at some of the at least one processor is a 128-byte cache line processor.

13. The computer of claim 11, wherein:
 the first row of the first side of the printed circuit board has four of the eighteen memory chips; and
 the third row of the first side of printed circuit board has four of the eighteen memory chips.

14. The computer of claim 11, further comprising:
 each of the eighteen memory chips have a substantially rectangular shape;
 the memory chips in the first and third rows on the first side of the printed circuit board have their long side aligned in a first direction; and
 the memory chips in the second and fourth rows the first side of the printed circuit board have their long side aligned in a second direction, the first direction being perpendicular to the second direction.

15. The computer of claim 14, further comprising the second row on the first side of the printed circuit board is horizontally aligned with the fourth row on the first side of the printed circuit board.

16. The computer of claim 11, wherein the at least x pins are distributed into four groups, the pins within each group having a pin pitch of less than 0.85 mm.

17. The computer of claim 16, wherein the pin pitch is 0.5 mm.

18. The computer of claim 11, further comprising an RCD chip on the first side of the printed circuit board and configured to provide four independent clock signals, including:
 a first clock signal to the memory chips on the left half of the first side of the printed circuit board;
 a second clock signal to the memory chips on the right half of the first side of the printed circuit board;
 a third clock signal to the memory chips on the left half of the second side of the printed circuit board; and
 a fourth clock signal to the memory chips on the right half of the second side of the printed circuit board.

19. The computer of claim 18, further comprising a plurality of data buffers.

20. The computer of claim 11, further comprising:
 the memory chips on the left half of the first side of the printed circuit board is part of a first channel; and
 a second clock signal to the memory chips on the right half of the first side of the printed circuit board is part of a second channel different from the first channel.

\* \* \* \* \*